United States Patent [19]

Bluzer

[11] Patent Number: 4,590,505
[45] Date of Patent: May 20, 1986

[54] THREE DIMENSIONAL OPTICAL RECEIVER HAVING PROGRAMMABLE GAIN SENSOR STAGES

[75] Inventor: Nathan Bluzer, Silver Spring, Md.

[73] Assignee: The United States of America as represented by the Secretary of the Air Force, Washington, D.C.

[21] Appl. No.: 569,639

[22] Filed: Jan. 10, 1984

[51] Int. Cl.⁴ .................................... H01L 29/78
[52] U.S. Cl. .................................... 357/24; 357/30; 377/60; 377/61
[58] Field of Search ................ 357/24, 30, 31, 32, 357/29; 307/311; 377/57–63

[56] References Cited

U.S. PATENT DOCUMENTS

| | | | |
|---|---|---|---|
| 3,887,917 | 6/1975 | Howard et al. | 343/7.9 |
| 4,071,906 | 1/1978 | Buss | 364/819 |
| 4,125,862 | 11/1978 | Catano | 358/140 |
| 4,209,853 | 6/1980 | Hyatt | 367/8 |
| 4,210,825 | 7/1980 | Crochiere et al. | 357/24 X |
| 4,216,503 | 8/1980 | Wiggins | 358/280 |
| 4,245,164 | 1/1981 | Funahashi | 357/24 X |
| 4,247,788 | 1/1981 | Bluzer | 307/221 |
| 4,288,866 | 9/1981 | Sackman | 367/11 |
| 4,314,743 | 2/1982 | Rast | 350/354 |
| 4,321,614 | 3/1982 | Bluzer et al. | 357/30 |
| 4,359,651 | 11/1982 | Bluzer | 307/311 |
| 4,363,963 | 12/1982 | Ando | 357/30 X |
| 4,467,342 | 8/1984 | Tower | 357/45 X |
| 4,471,375 | 9/1984 | Oritsuki et al. | 357/30 X |
| 4,499,590 | 2/1985 | Bluzer | 357/30 X |

Primary Examiner—Andrew J. James
Assistant Examiner—S. Crane
Attorney, Agent, or Firm—Donald J. Singer; Richard J. Donahue

[57] ABSTRACT

A three dimensional optical image receiver having sensor stages with a programmable gain capability. Operation of the receiver occurs entirely in the charge domain upon the charge initially generated by the optical signal.

7 Claims, 13 Drawing Figures

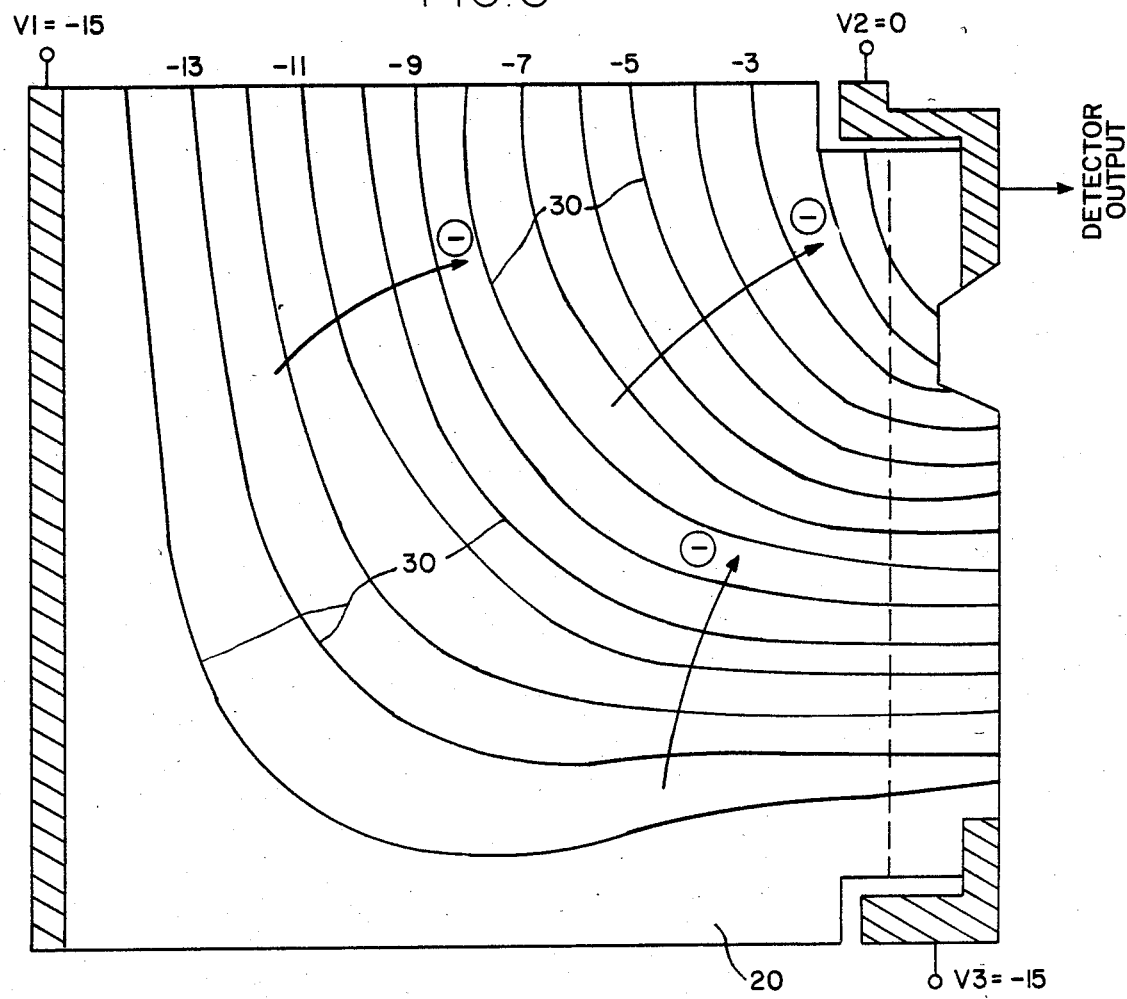
FIG. 6
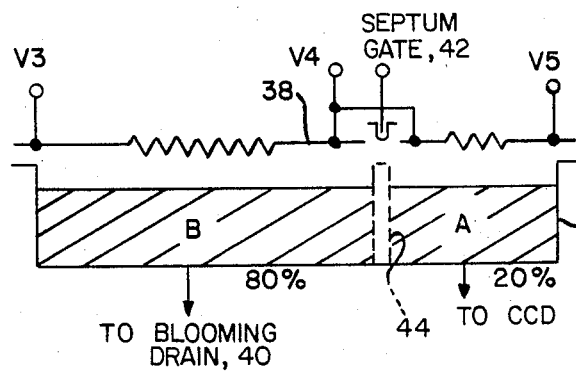
FIG. 9A (HIGH SIGNAL LEVEL)
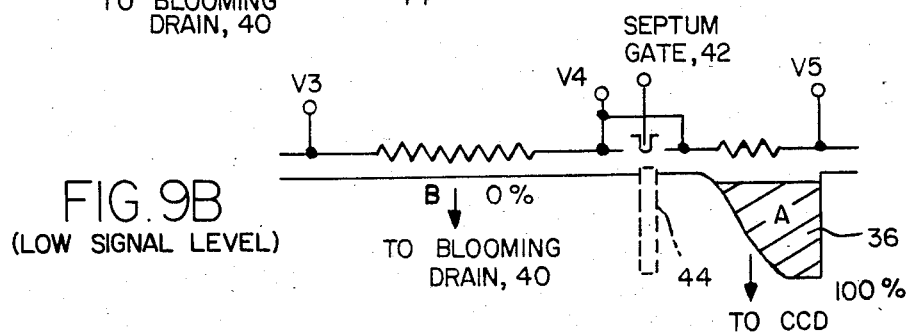
FIG. 9B (LOW SIGNAL LEVEL)

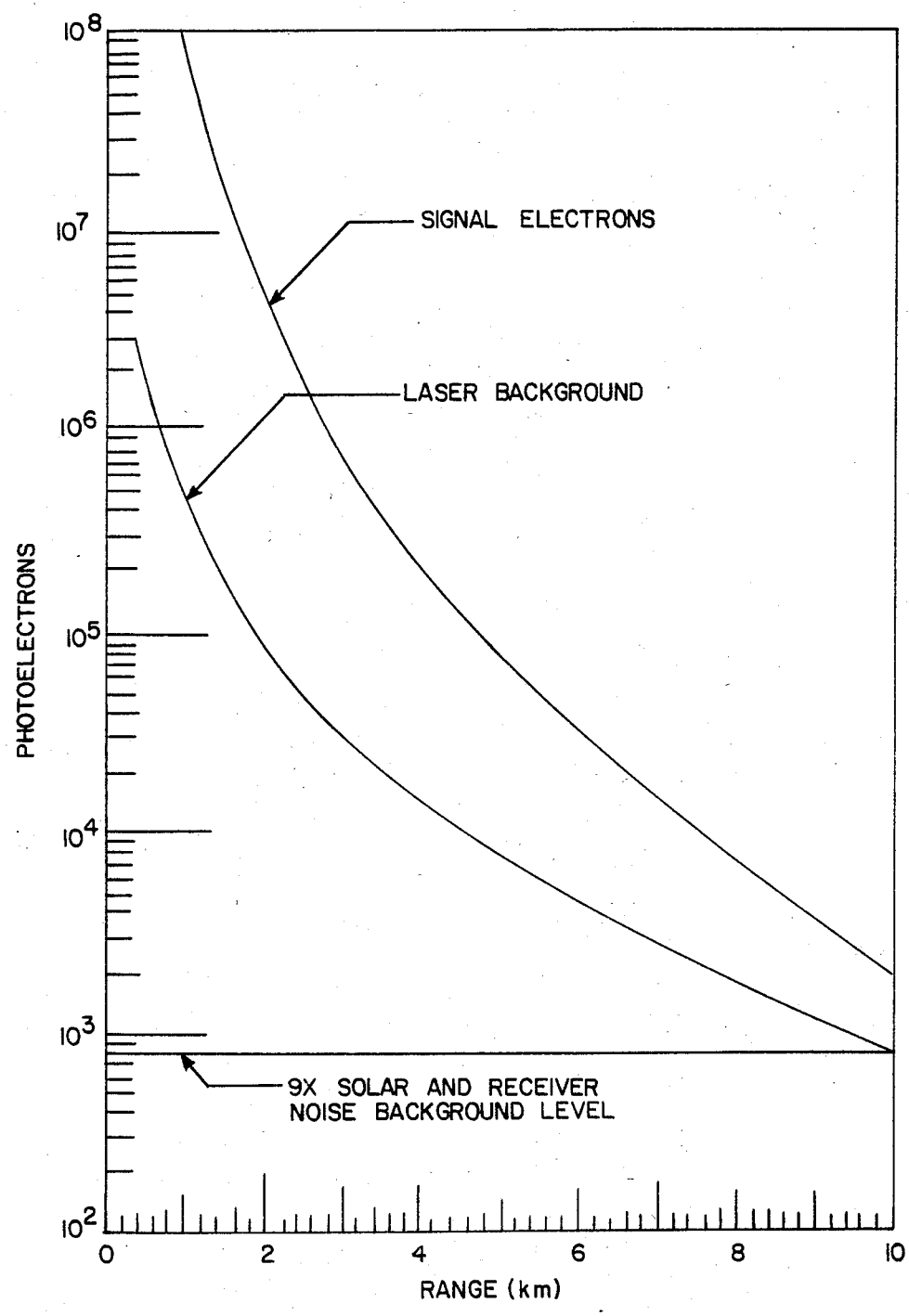

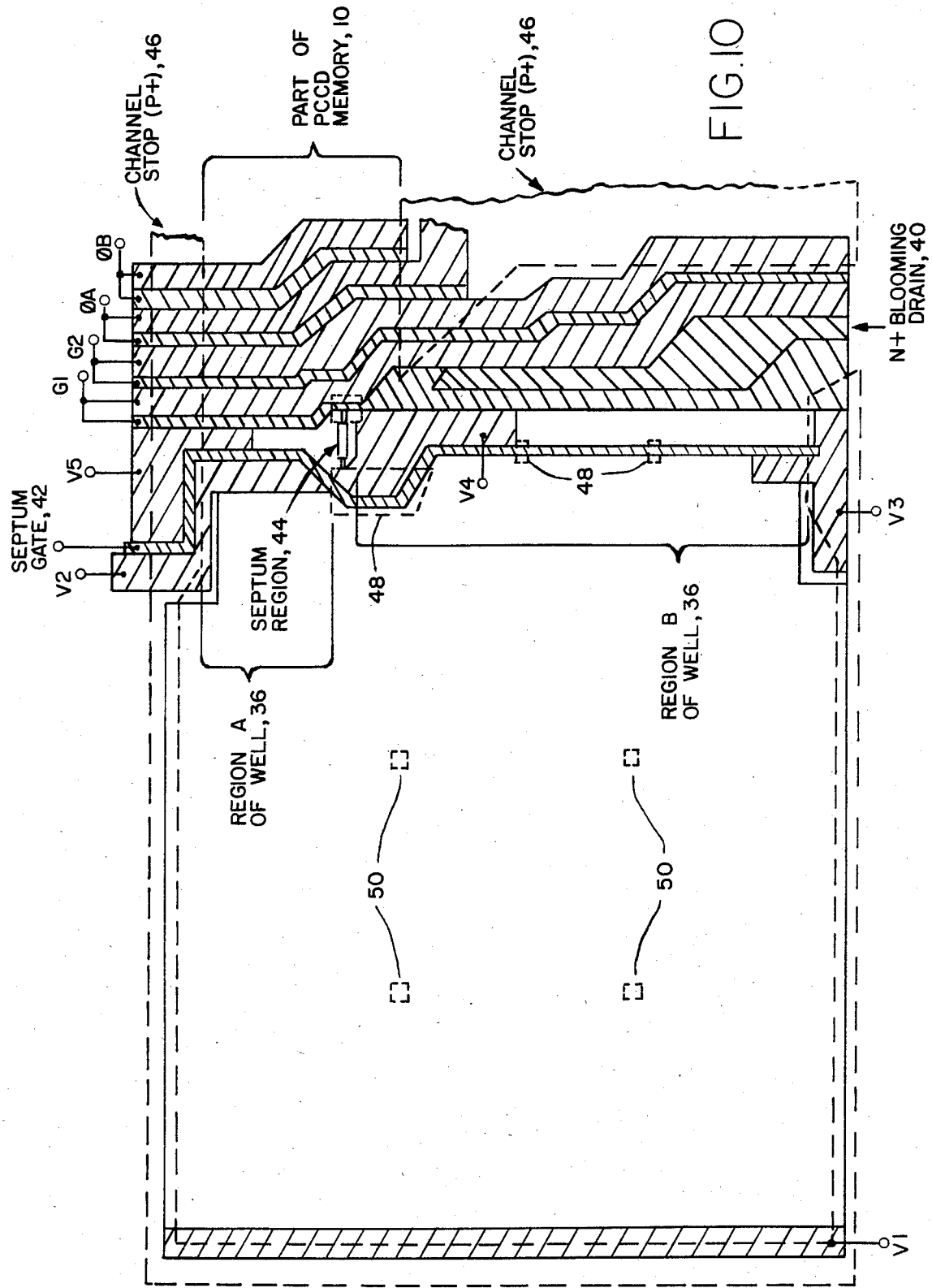

THREE DIMENSIONAL OPTICAL RECEIVER HAVING PROGRAMMABLE GAIN SENSOR STAGES

STATEMENT OF GOVERNMENT INTEREST

The invention described herein may be manufactured and used by or for the Government for governmental purposes without the payment of any royalty thereon.

BACKGROUND OF THE INVENTION

The present invention relates to optical signal detection and processing apparatus and more particularly to a three-dimensional image receiver having sensor stages with programmable gain capability.

Receivers for optical range applications require a capability for three dimensional imaging. Two out of the three dimensions are the traditional X-Y co-ordinates. The third dimension, depth, is obtained by optical ranging. For example, if a laser pulse is sent out to image a scene, the time the reflected laser pulse will arrive at the receiver depends on the range. Thus, if a large object is illuminated by a laser pulse, the reflections will not only have spatial variations due to object's structure but will also arrive at different times at the detector depending on range. The range dimension will be modulated by the object's depth or Z axis characteristics.

Imaging in three dimensions can be accomplished if two-dimensional image slices are taken at different times. Different times represent the range or distance of different features of the object from the receiver. A record of these 2-D images taken at different time intervals can be used to reconstruct a 3-D image. However, mechanization of this concept requires a special imaging receiver. Specifically, a high speed detector array is needed to take image samples of the scene at very close time intervals.

The need for programmable gain in conjunction with the visible detectors used for the ranging application is also critical. The optical signal detected varies in amplitude much like an electrical return to a radar receiver, i.e., very large levels at close ranges and low levels at long ranges. Moreover, the bandwidth required for operating these sensors (50 MHz) coupled with the low signal levels to be detected require special receivers. Optimally, a receiver which employs bandwidth compression will provide the best range performance.

SUMMARY OF THE INVENTION

It is therefore an object of the present invention to provide an image receiver having novel sensor units capable of taking image samples of a scene at very close time intervals.

It is another object of the present invention to provide an optical image receiver having high speed sensor units with a programmable gain characteristic.

It is a further object of the present invention to provide improved apparatus for sensing and storing optically-generated data and for processing such data for display.

It is a feature of the present invention that the operation of the image receiver occurs entirely in the charge domain.

Other objects, advantages and novel features of the invention will become apparent from the following detailed description of the invention when considered in conjunction with the accompanying drawings.

BRIEF DESCRIPTION OF THE DRAWINGS

FIG. 6 is an illustration of the equal potential lines formed on the resistive sheet of the detector for low level signal conditions;

FIG. 7 is a graph of the signal and noise background input levels to the detector as a function of range;

FIGS. 9A and 9B are illustrations of the operation of the programmable gain stage of the present invention;

FIG. 10 is an illustration of the basic structure of the programmable gain sensor stage;

DESCRIPTION OF THE PREFERRED EMBODIMENT

The disclosed embodiment of the invention is designed to provide 20 nanosecond sample intervals for a three meter resolution in range. The samples taken at 20 nanosecond intervals are recorded into a memory to provide the range (Z axis) information. Hence, when the information from the X-Y detector array is recorded into a memory, with samples taken 20 nanoseconds apart, a three dimensional image is realized. Implicitly, each detector requires a memory buffer. For a 3-D receiver with 240 detector elements, 240 memory buffers are required, each one to record the output from a single detector. The number of stages in each memory buffer, eg. 200, determines the image dimension on the Z-axis.

Figure 1:
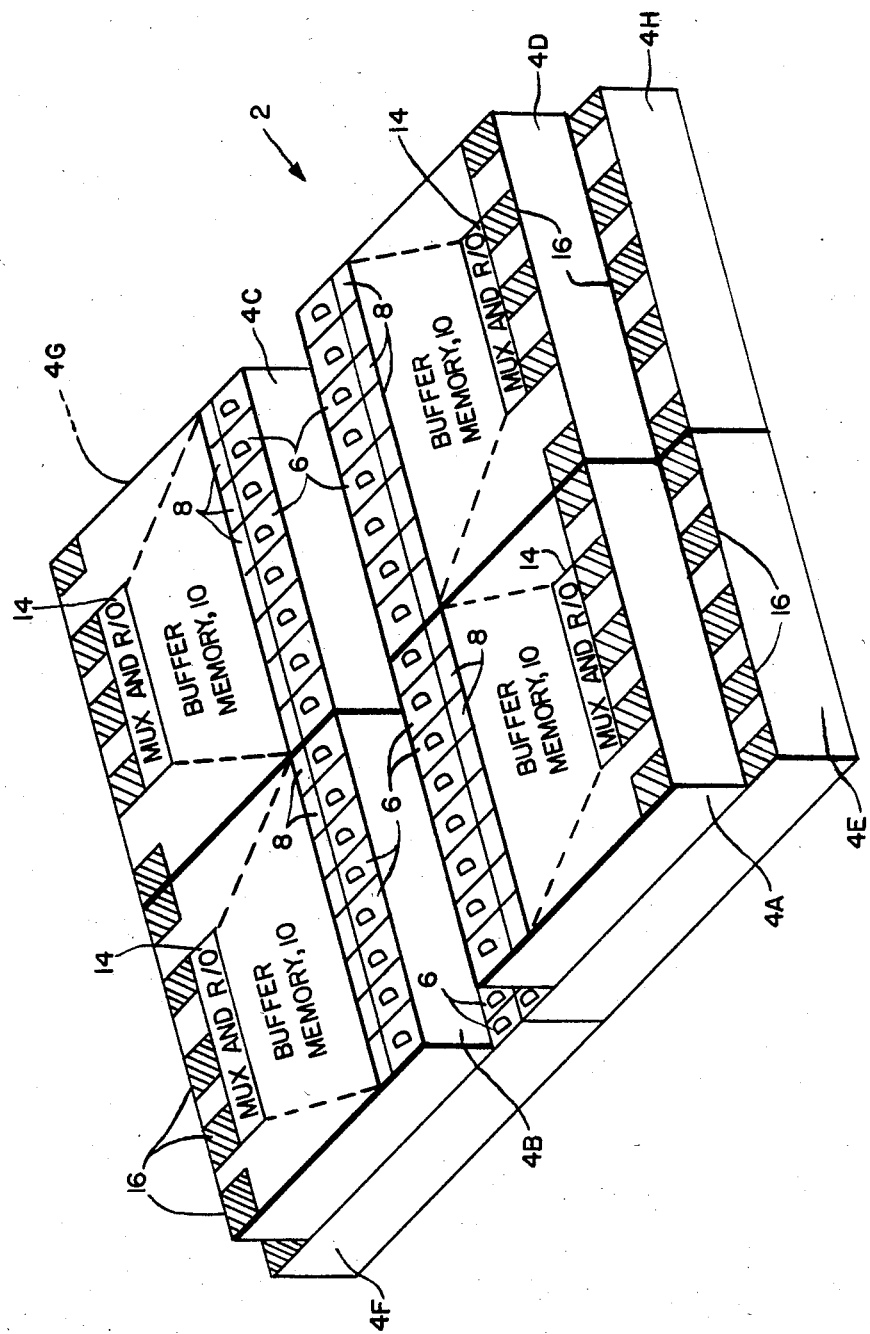
FIG. 1 is a pictorial representation of the staircase architecture of a three-dimensional image receiver of the present invention.

As shown in FIG. 1 of the drawings, an image receiver 2 is formed by a staircase configuration of stacked individual sensor units 4A-4H each having an array of detectors 6 with a programmable gain stage 8 associated therewith. The output of each programmable gain stage 8 of each sensor unit 4A-4H is coupled to the common buffer memory 10 of the unit wherein distinction between image samples is maintained, and whose output is in turn connected to a multiplexer and readout circuit 14 on the unit. Bonding pads 16 provide a means for applying power to the sensor units 4A-4H and for retrieving data therefrom. It will be evident from FIG. 1 of the drawings that infraposed sensor units 4E-4H are made somewhat larger than sensor units 4A-4D in order to expose their detectors 6 and provide access to their bonding pads 16. The receiver of FIG. 1 is analogous to a phased array radar antenna where each element has an analog memory buffer for range storage.

Figure 2:
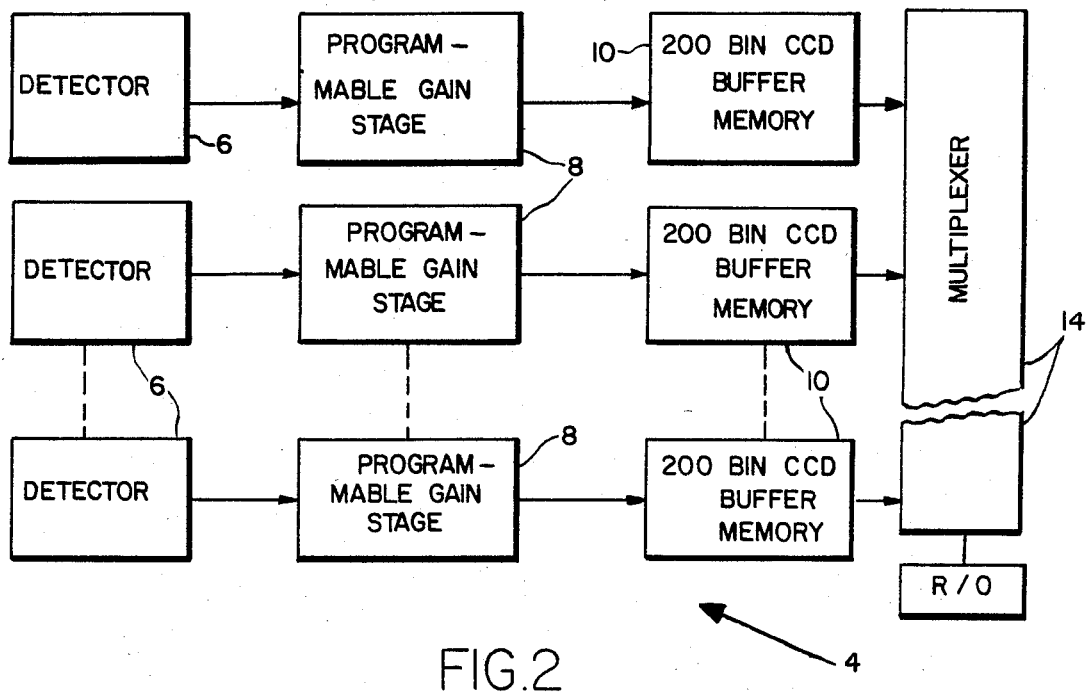
FIG. 2 is a block diagram of one of the sensor units used to form the three-dimensional image receiver.

The configuration of each sensor unit in FIG. 1 is shown in more detail in the functional block diagram of FIG. 2. Each detector 6 has a programmable gain stage 8 and an analog 200-element buffer memory 10 associated therewith. The architecture shown in FIG. 2 for the sensor units 4A-4H has been selected for the following reasons. The duty cycle of the three-dimensional imaging receiver is small, i.e., a 3-D image may be taken every 3 milliseconds. For the range over which the receiver is operated, all of the 3-D image information arrives in less than 40 microseconds. Hence, most of the time in between laser pulses is not used. The low operating duty cycle of the detector can be used to reduce the output bandwidth if bandwidth compression is employed. With bandwidth compression, the receiver noise is lowered by band-limiting the bandwidth of the amplifier. That is, transient recording, the image information is recorded very fast (40 usec) in the analog buffer memory 10 and read out in a time equal to 3 milliseconds less the recording time. The advantage of bandwidth compression for improving the performance range of the 3-D sensor is clearly recognizable. Mechanization of the bandwidth compression makes use of peristaltic charge coupled device analog memories.

Several requirements are imposed on the architecture of the detector 6 and programmable gain stages 8 of the 3-D sensor. The bandwidth compression requirement for improved performance dictates that the operation of the detector 6 and programmable stage 8 be entirely in the charge domain and in particular, operation on the same charge that the optical signal generated. If this requirement is not satisfied, signal to noise enhancement through bandwidth compression will be severly limited. This is because any signal amplification prior to readout will define a wider operating noise bandwidth (equal to the recording bandwidth) thereby capturing the noise over a wider bandwidth and making subsequent bandwidth compression very limited for signal to noise enhancement.

Figure 3:
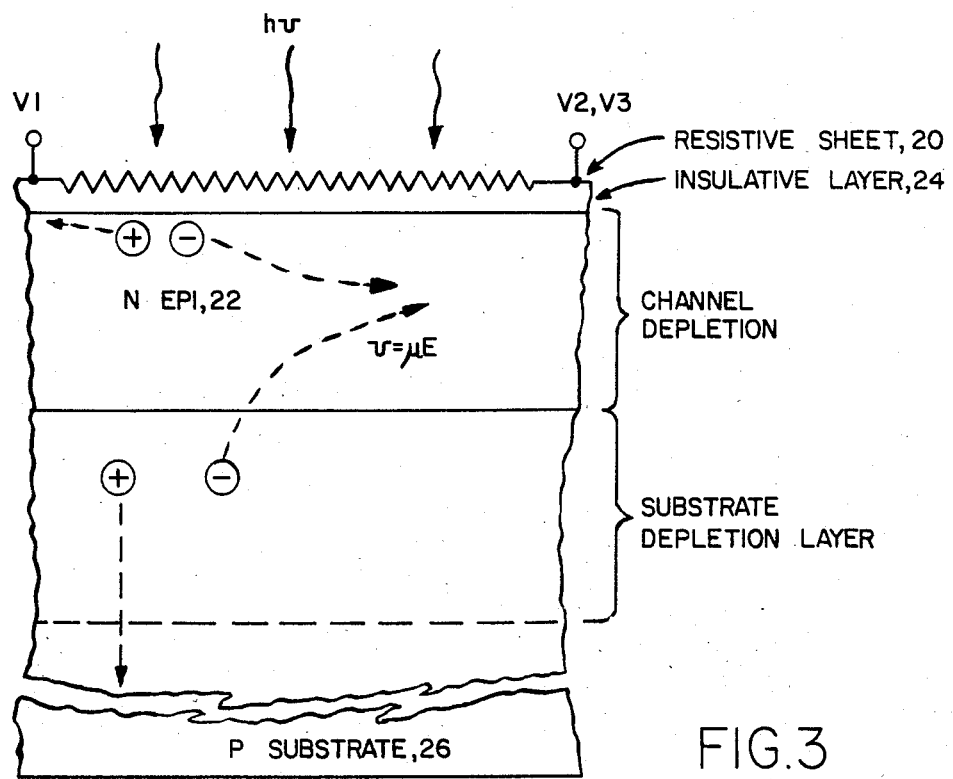
FIG. 3 is a vertical profile of the detector portion of a sensor unit.

Other characteristics needed of each detector and programmable gain stage combination are fast frequency response, good quantum efficiency and programmable gain (attenuation) to resolve the incompatibility between the detector output and the PCCD memory buffer charge capacity. System requirements dictate a detector with a good quantum efficiency. Since the detected signal is destined to go into a PCCD memory buffer, the detector selected also contains an epitaxial (N epi on P substrate) architecture. The vertical profile of the detector 6 used for the 3-D sensor is shown in FIG. 3. Photons, hv, are incident on the silicon detector through the resistive sheet 20 biased by voltages V1, V2, and V3. The resistive sheet 20 is formed over an N epitaxial region 22 and insulated therefrom by insulative layer 24. The N epi region is depleted by biasing V1, V2, and V3 and the P substrate 26 negative relative to the potential of the N epi region 22. Sufficient bias is applied to the detector to produce depletion regions sufficiently wide to collect quickly the photogenerated electrons and operate at a high quantum efficiency at 0.5 um and 0.82 um.

A field across the resistive sheet produced by voltages V1, V2, and V3 is such as to transport the carriers toward the programmable gain stage, i.e., left to right. This directional transport is achieved by making V1 more negative than V2 and V3 while V1, V2 and V3 are concurrently more negative than the epi potential minima.

The operating speed of the detectors 6 is determined by the speed with which photogenerated carriers will be transported from the detectors 6 into their associated programmable gain stage 8. The total response time of each detector 6 will be a vector sum of the vertical and horizontal charge transfer times from the detector to the programmable gain stage. The response of the detector in the vertical direction is sufficiently fast for a 50 MHz (20 nanoseconds) operating speed. An additional consideration is the detector response speed, i.e., maximum dispersion in the plane. System requirements dictate detectors 6 which are 254×254 micrometers in size. Hence the transport of carriers across this distance should be less than 20 nanoseconds. The high speed transport is achieved by creating a field in the N-epi with the resistive sheet profile shown in FIG. 4. The time, $\Delta T$, for electron transport is determined by the field and mobility of carriers in the N-epi regions. The times of high electron transport in the plane have been calculated and are provided in the table below:

| $\Delta T$ TRANSPORT IN PLANE AVERAGE FIELD - 500 V/cm | |
|---|---|
| $\Delta T$ (sec) | T (K) |
| $25 \times 10^{-9}$ | 245 |
| $12.5 \times 10^{-9}$ | 160 |
| $7.1 \times 10^{-9}$ | 110 |
| $5.6 \times 10^{-9}$ | 77 |

Figure 4:
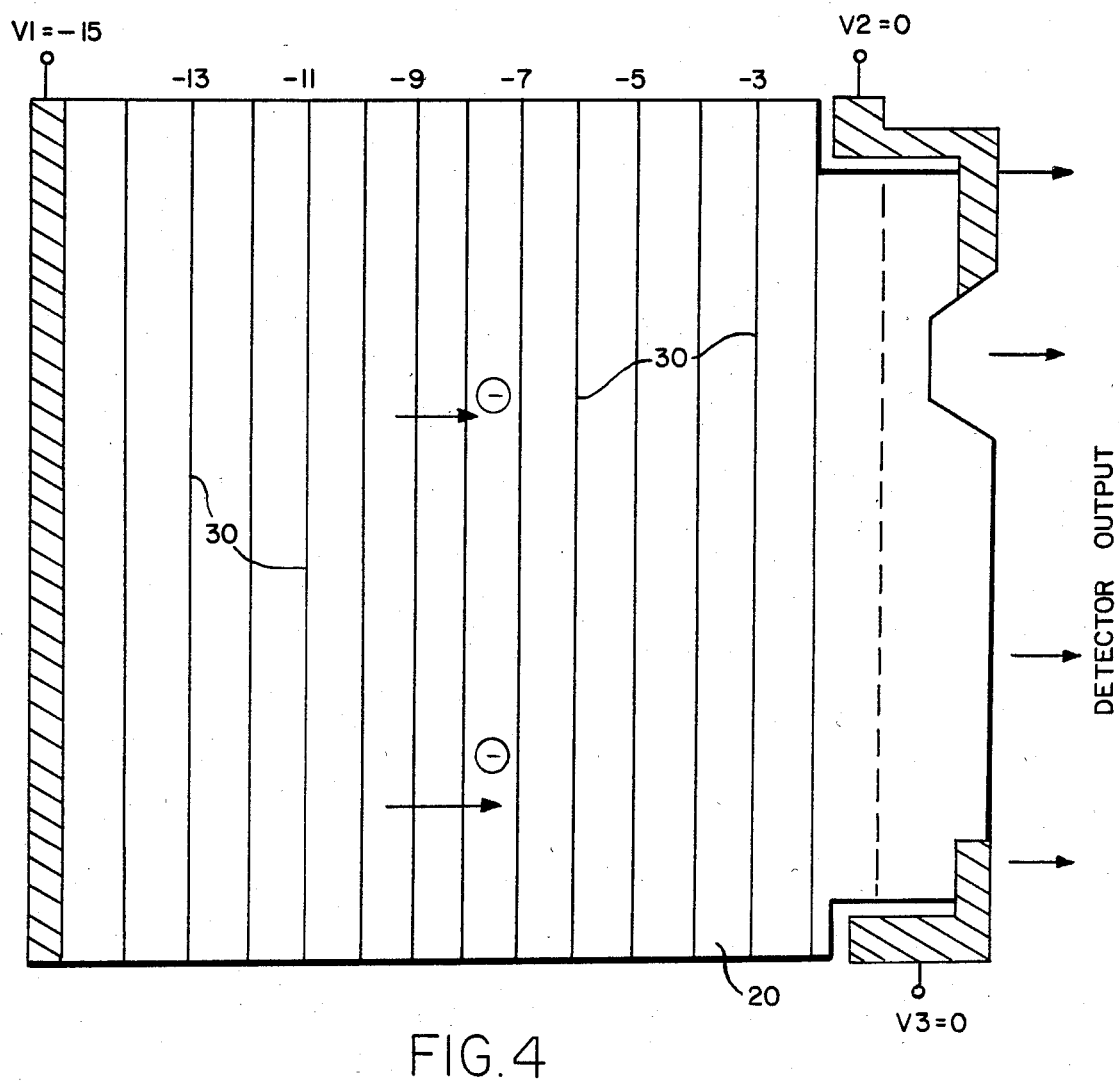
FIG. 4 is an illustration of the equal potential lines formed on the resistive sheet of the detector for high signal conditions.
Figure 5:
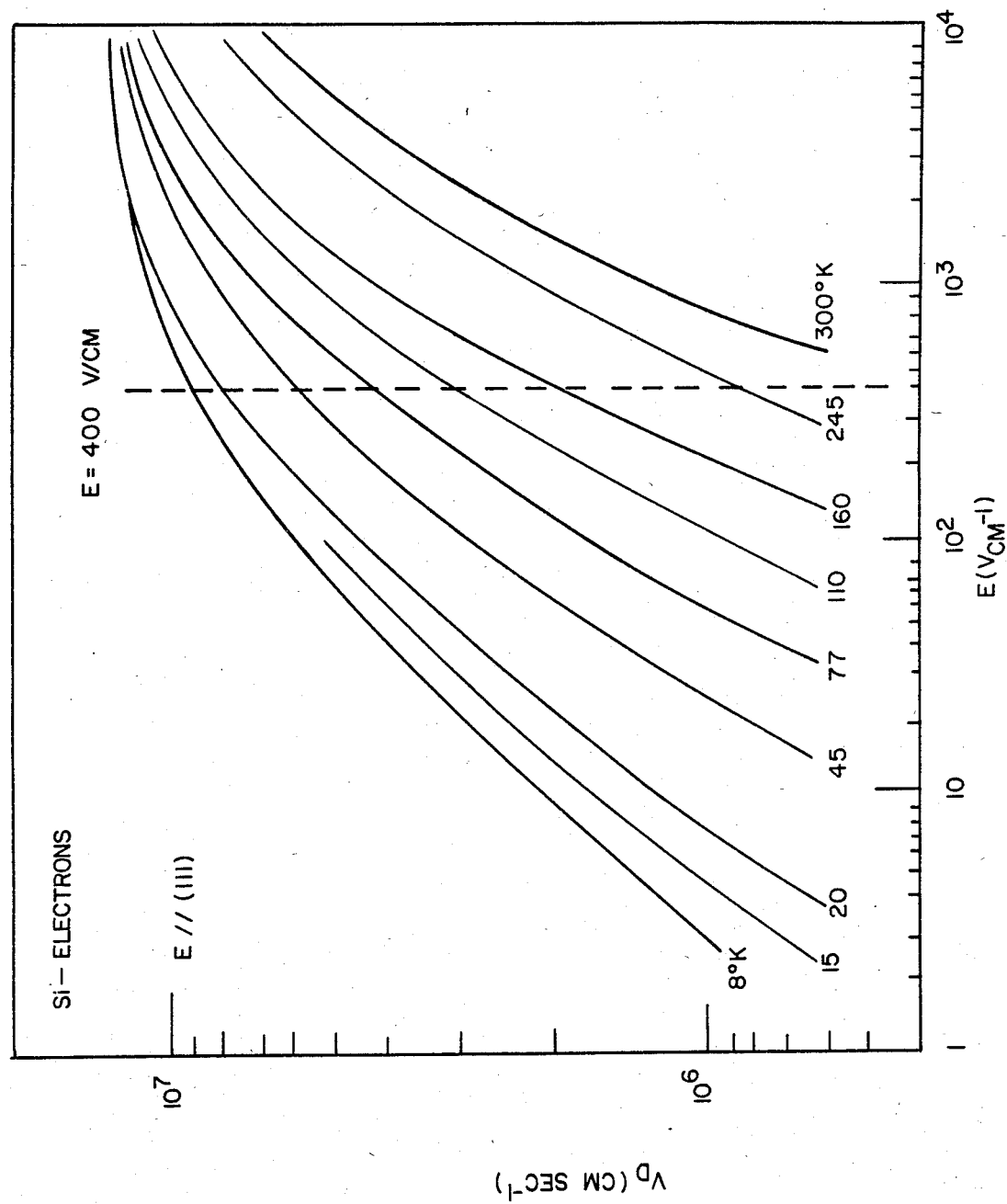
FIG. 5 is a graph depicting the mobility of electrons in the silicon material of the detector as a function of temperature and electric field.

These calculations have been obtained by realizing that the mobility of electrons in silicon is a function of temperature as shown in the graph of FIG. 5. At lower temperature, the detector speed is faster and readily meets the 20 nanoseconds speed desired for a three meter range resolution. The electric field, as shown by the equal potential lines 30 on the resistive sheet in FIG. 4 is configured to transport all the photogenerated electrons in parallel from left to right towards the detector's output port. The condition represented is for high optical signal levels incident onto the detector. When the detector is exposed to a low level signal, i.e., for longer ranges, the equal potential lines 30 are configured as shown in FIG. 6 to channel the photo-generated electrons into one corner of the detector. The equal potential lines 30 on the resistive sheet differ in FIGS. 4 and 6 by the changing of the value of voltage V3 from 0 to −15 volts. Changing of the equal potential lines for 30 low and high optical signal conditions will be discussed below with the operation of the programmable gain stage 8 positioned adjacent to the detector's output.

The need for programmable gain between the detector and the PCCD (peristaltic charge coupled device) buffer memory 10 is due to the dynamic range of the optical input signal as shown in the graph of FIG. 7. The dynamic range of the input signal is large, that is between $10^9$ photoelectrons and $10^2$ photoelectrons. The dynamic range of the background is between $3 \times 10^6$ photoelectrons and $10^2$ photoelectrons. The CCD (charge coupled device) well capacity in the PCCD buffer memory 10 is $2 \times 10^6$ electrons/well. The incompatibility between the detector and CCD is clearly evident.

Figure 8:
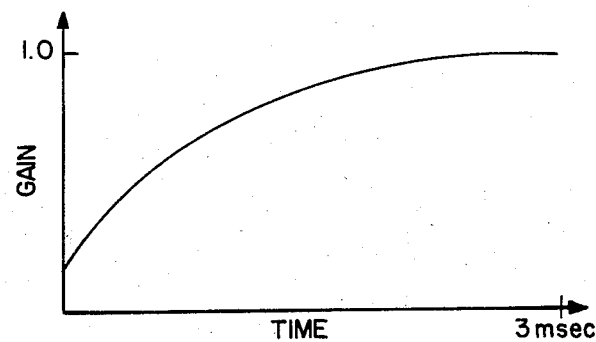
FIG. 8 is a graph depicting the gain of the sensor unit as a function of time.

A programmable gain stage is therefore required which will reconcile the incompatibility between the detector's output and the PCCD buffer memory's charge capacity. The programmable gain stage will be controlled externally to have a maximum attenuation for large signals, i.e., close ranges and unity gain for low level signals, e.g., long ranges. Hence for a laser light pulse used as the light source, the programmable gain should vary with time like the gain curve illustrated in FIG. 8.

The characteristics of the programmable gain stage 8 have to be compatible with the bandwidth reduction scheme proposed for the 3-D sensor. The operating bandwidth for the programmable gain stage 8 should be independent of signal. Operation of the gain stage 8 should be in the charge domain, i.e., the input and output charge signals from the programmable gain stage should be only those charges which were photogenerated by the optical signal. Under such conditions, the noise introduced by the programmable gain stage 8 should be minimal, especially at low signal levels. Such a programmable stage has been formulated and its operational principle is discussed below with respect to FIGS. 9A and 9B.

Shown in FIGS. 9A and 9B are illustrations of the cross-section of the programmable gain stage 8 depicting its operation at its two extreme operating conditions. Gain or attenuation levels between one and one-fifth can be realized by adjusting the voltage potentials V3, V4 and V5. At low gains i.e., 0.2, the operation of the programmable gain stage begins when photogenerated signal charge from a detector 6 enters the programmable gain stage well 36 and is integrated in the well formed by a resistive gate 38 with controls V3, V4 and V5. Any signal exceeding the $10^7$ electrons well capacity is discarded into the blooming drain 40. At the end of the integration time, the signal in the well is split into two parts by the action of a septum gate 42 acting upon the integration well in region 44. Additionally, during the charge splitting operation, the septum gate blocks any signal from the detector from entering into the integration well 36. The signal in region A of well 36 is clocked into the CCD buffer memory represented by gates ∅A, ∅B by the action of gates G1 and G2 (See FIG. 10). Concurrently, charge from region B of well 36 is clocked into the N+ blooming drain 40 by the action of gate G1. After the aforementioned sequence of operations, the operation of the programmable gain stage 8 is again cycled.

As shown in FIG. 10, the integration well 36 is located under and controlled by a gate which has three controlled voltages (V3, V4, and V5) and is adjacent to the detector. The septum gate 42 is also located across the integration well 36 and, as mentioned above, splits the integration well's signal into two parts (A and B) by partitioning the well 36 at region 44. When the detector input signal into the integration well 36 exceeds $10^7$ electrons, this excess flows into the N+ blooming drain 40 according to the blooming level established by gate G1. Furthermore, because of the configuration of the P+ channel stops 46, the N+ blooming drain 40 also prevents blooming of signals in the well formed by gate G1 after they have been injected therein from the integration well 36. This feature prevents subsequent blooming of the signal injected into the PCCD buffer memory 10.

Figure 11:
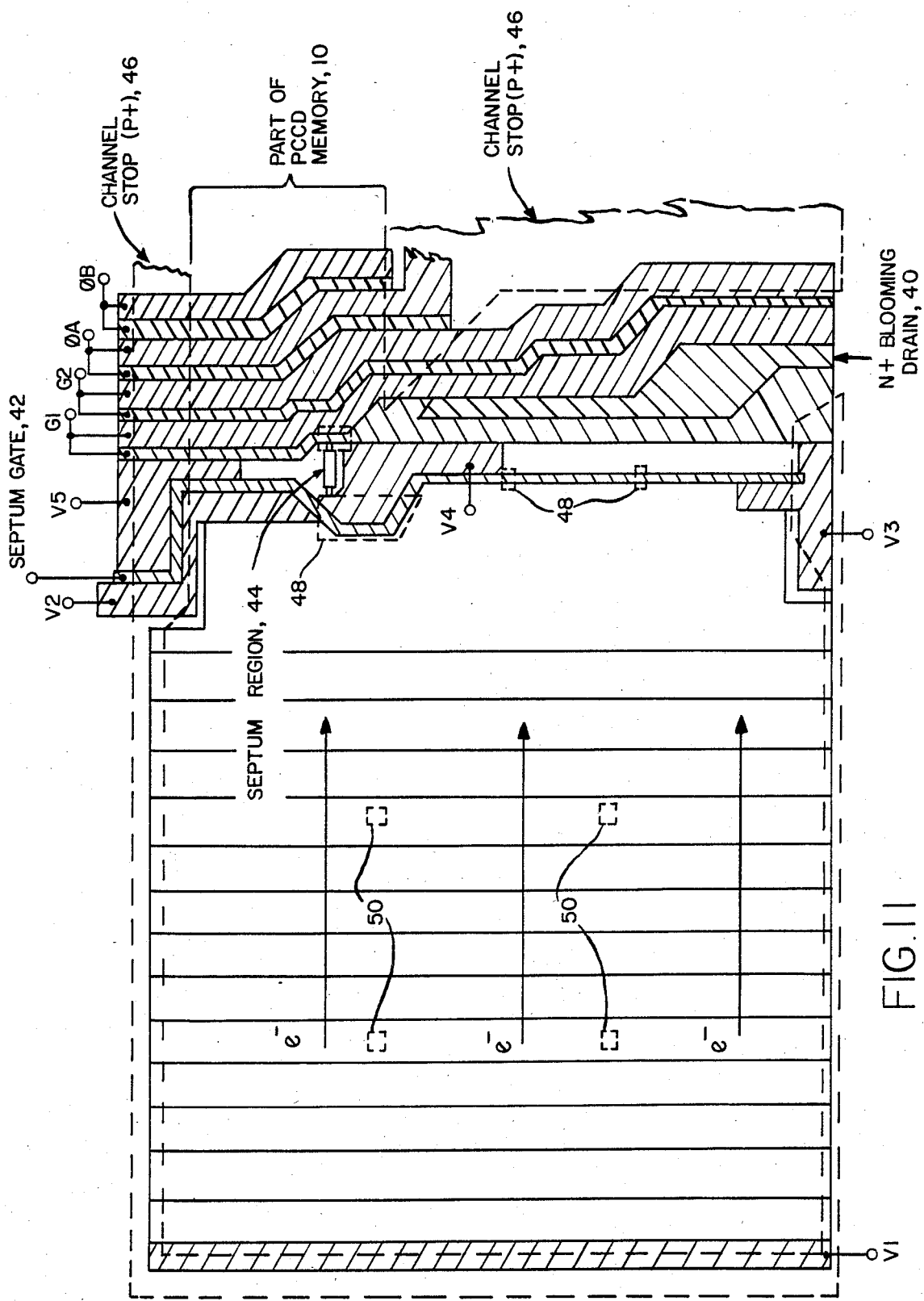
FIG. 11 is an illustration of the programmable gain sensor stage for high level signals.

Operating speed of the programmable gain stage 8 is facilitated by properly adjusting the resistive sheet 20 over the detector 6. At high signal levels, charge should flow uniformly into the entire width of the integration well 36 hence the detector equipotential field lines 30 are parallel, as depicted in FIG. 11, for distributing uniformly the photogenerated electrons across the entire integration well. Such a distribution means equal charge density in well regions A and B (see FIG. 9A) is achieved faster, and operation of charge splitting by the septum gate 42 is proper without any delays necessary for charge equalization.

Figure 12:
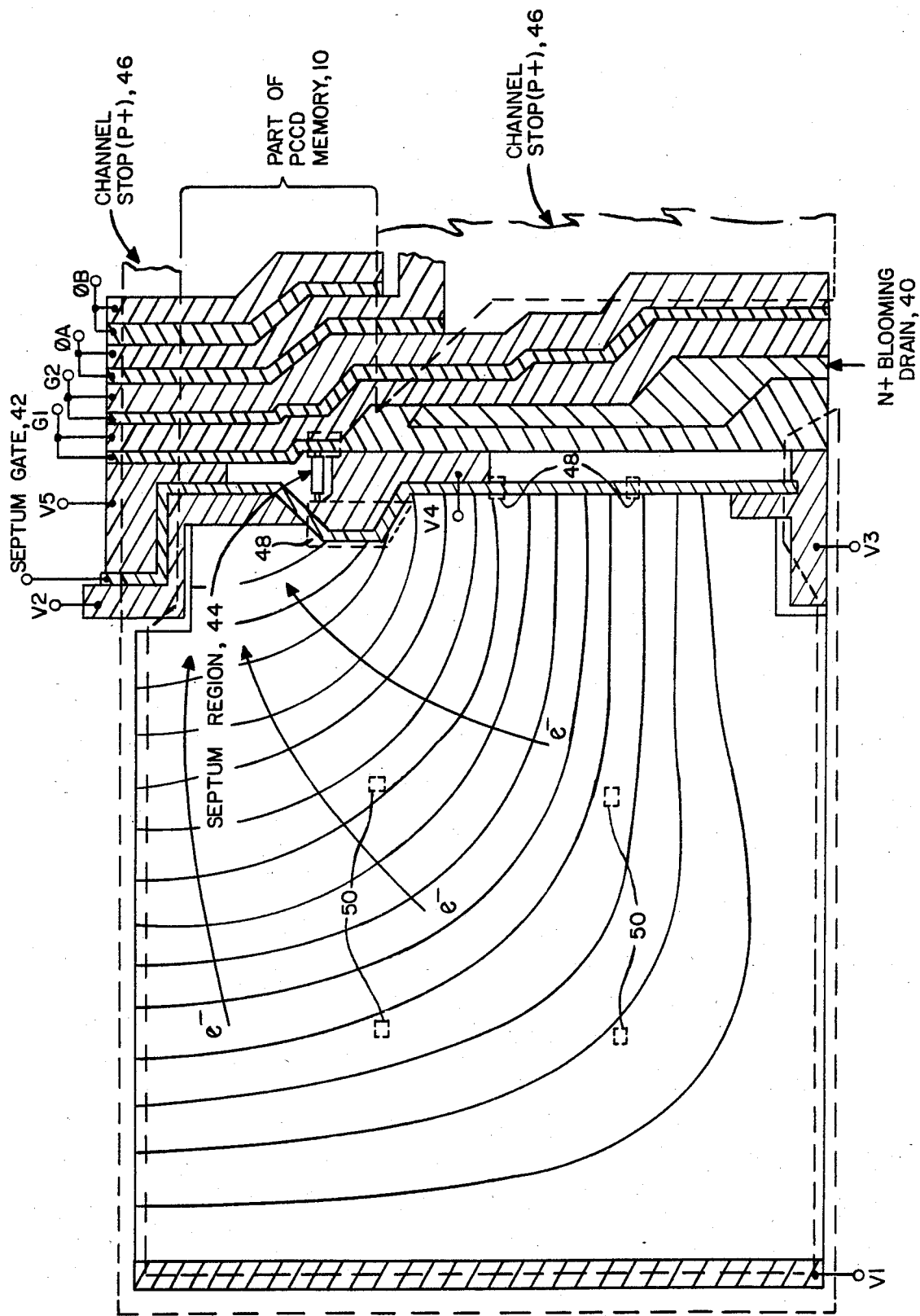
FIG. 12 is an illustration of the programmable gain sensor stage for low level signals.

At low signal levels, it is more time efficient to collect the photogenerated electrons at the region of the integration well 36 where they are destined before the septum gate 42 is activated. This collection is facilitated by adjusting the field potentials on the detector 10, as shown in FIG. 12, so the electrons are collected in region A of the integration well 36. Furthermore, the configuration of the integration well is such that the action of the septum gate 42 does not split off any charge at very low signal levels. This feature is important to insure that no noise is added to the signal in the integration well at low signal levels. Finally, P+ channel stops 46 are strategically distributed under the septum gate and within the detector to obtain improved performance. P+ diffusions 50 in the detector area provide collection regions for photogenerated holes. P+ diffusions 48 under the septum prevent lateral redistribution of charge in the integration well 36 by flowing under the septum gate 42.

Although the invention has been described with reference to a particular embodiment, it will be understood to those skilled in the art that the invention is capable of a variety of alternative embodiments within the spirit and scope of the appended claims. An operative device can also be formed, for example, by interchanging the donor and acceptor dopants with each other as well as inverting the bias potential; that is, specifically by changing the P type substrate to an N type substrate, replacing the N epi material by P epi material, replacing the P+ channel stops by N+ channel stops, replacing the Nt blooming drain by a P+ blooming drain, and by replacing the potentials on the gates to be repulsive for holes instead of electrons.

What is claimed is:

1. A three dimensional imaging receiver having a plurality of sensor units stacked in a staircase configuration whereby image detection positions of infraposed ones of said sensor units are exposed to form a composite image detection area for said receiver, each of said sensor units comprising:
   a plurality of radiation detectors,
   a plurality of programmable gain stages each coupled to one of said plurality of detectors,
   a buffer memory coupled to each of said programmable gain stages, and
   multiplexing and readout means coupled to said buffer memory for deriving image data from said receiver;
   said plurality of radiation detectors each including:
   a substantially rectangular segment of P-type semiconductor material having a first edge adjacent one of said plurality of programmable gain stages,
   an N-epitaxial layer formed on the top surface of said rectangular segment,
   an insulative layer formed on the top surface of said N-epitaxial layer,
   a resistive sheet disposed on the top surface of said insulative layer,
   first biasing means positioned along a second edge of said rectangular segment,
   second biasing means positioned adjacent the corner of said first edge and a third edge of said reactangular segment, and third biasing means positioned adjacent the corner of said first edge and a fourth edge of said rectangular segment, said first, second and third biasing means having potentials applied thereto for selectively altering the shape of the electric field established within said resistive sheet.

2. Apparatus as defined in claim 1 wherein each of said plurality of programmable gain stages comprise:

an integration well formed at an edge of said programmable gain stage adjacent said first edge of an associated one of said plurality of radiation detectors, a septum having a portion thereof positioned within the confines of said integration well, said septum being adapted when activated to block further charge flow into said integration well from said associated one of said plurality of radiation detectors and to divide said integration well into first and second charge storage regions, and gating means for transferring charge formed in said first storage region, to said buffer memory and for discarding charge formed in said second storage region.

3. Apparatus as defined in claim 2 wherein said buffer memory comprises a peristaltic charge storage device.

4. Apparatus as defined in claim 3 wherein said multiplexing and readout means comprise a charge coupled device.

5. A sensor for optical radiation comprising:
a plurality of radiation detectors,
a plurality of programmable gain stages each coupled to one of said plurality of detectors,
a buffer memory coupled to each of said programmable gain stages, and
multiplexing and readout means coupled to said buffer memory for deriving image data from said sensor;
said plurality of radiation detectors each including:
a substantially rectangular segment of P-type semiconductor material having a first edge adjacent one of said Plurality of programmable gain stages,
an N-epitaxial layer formed on the top surface of said rectangular segment,
an insulative layer formed on the top surface of said N-epitaxial layer,
a resistive sheet disposed on the top surface of said insulative layer,
first biasing means positioned along a second edge of said rectangular segment,
second biasing means positioned adjacent the corner of said first edge and a third edge of said rectangular segment, and third biasing means positioned adjacent the corner of said first edge and a fourth edge of said rectangular segment, said first, second and third biasing means having potentials applied thereto for selectively altering the shape of the electric field established within said resistive sheet.

6. Apparatus as defined in claim 5 wherein said plurality of programmable gain stages each include:

an integration well formed at an edge thereof adjacent said first edge of an associated one of said plurality of radiation detectors, a septum having a portion thereof positioned within the confines of said integration well, said septum being adapted when activated to block further charge flow into said integration well from said associated one of said plurality of radiation detectors and to divide said integration well into first and second charge storage regions, and gating means for transferring charge formed in said first storage well to said buffer memory and for discarding charge formed in said second storage region.

7. A sensor for optical radiation comprising:
a plurality of radiation detectors,
a plurality of programmable gain stages each coupled to one of said plurality of detectors,
a buffer memory coupled to each of said programmable gain stages, and
multiplexing and readout means coupled to said buffer memory for deriving image data from said sensor;
said plurality of radiation detectors each including:
a substantially rectangular segment of N-type semiconductor material having a first edge adjacent one of said plurality of programmable gain stages,
a P-epitaxial layer formed on the top surface of said rectangular segment,
an insulative layer formed on the top surface of said P-epitaxial layer,
a resistive sheet disposed on the top surface of said insulative layer,
first biasing means positioned along a second edge of said rectangular segment,
second biasing means positioned adjacent the corner of said first edge and a third edge of said rectangular segment, and
third biasing means positioned adjacent the corner of said first edge and a fourth edge of said rectangular segment,
said first, second and third biasing means having potentials applied thereto for selectively altering the shape of the electric field established within said resistive sheet.

* * * * *